United States Patent [19]
Huang et al.

[11] Patent Number: 5,610,098
[45] Date of Patent: Mar. 11, 1997

[54] N-INP SCHOTTKY DIODE STRUCTURE AND A METHOD OF MAKING THE SAME

[75] Inventors: Wen C. Huang; Tan F. Lei; Chung L. Lee, all of Hsinchu, Taiwan

[73] Assignee: National Science Council, Taipei, Taiwan

[21] Appl. No.: 612,114

[22] Filed: Mar. 7, 1996

Related U.S. Application Data

[62] Division of Ser. No. 426,643, Apr. 21, 1995, Pat. No. 5,517,054, which is a continuation of Ser. No. 255,163, Jun. 7, 1994, abandoned.

[51] Int. Cl.$^6$ ..................... H01L 21/44
[52] U.S. Cl. ................ 437/176; 437/175; 437/179; 257/472
[58] Field of Search ................. 437/175, 176, 437/177, 179; 257/471, 472, 485, 486

[56] References Cited

U.S. PATENT DOCUMENTS

| | | | |
|---|---|---|---|
| 4,170,818 | 10/1976 | Tobey, Jr. et al. | 257/281 |
| 4,990,988 | 2/1991 | Lin | 257/769 |

OTHER PUBLICATIONS

J. R. Waldrop, S. P. Kowalczyk, and R. W. Grant, "Summary Abstract: Fermi-level pinning energy and chemistry at InP(100) interfaces", J. Vac. Sci. Technol. B 1(3), Jul.–Sep. 1983.

J. Dunn and G. B. Stringfellow, "Ag/Al Schottky Contacts on n–InP", Journal of Electronic Materials, vol. 17, No. 2, 1988.

Z. Q. Shi, R. L. Wallace, and W. A. Anderson, "High–barrier height Schottky diodes on N–InP by deposition on cooled susbstrates", Appl. Phys. Lett. 59(4), 22 Jul. 1991.

*Primary Examiner*—Jerome Jackson
*Assistant Examiner*—Nathan K. Kelley
*Attorney, Agent, or Firm*—Hitt Chwang & Gaines, P.C.

[57] ABSTRACT

A new Schottky diode structure, Pt/Al/n-InP, is disclosed in the present invention. The thickness of Al layer of the Schottky diode structure is restricted in a range of about 80–120 Å. This structure gives a barrier height of 0.74 eV and an ideality factor of 1.11 after it was annealed at 300° C. for 10 min. This is due to the formation of Aluminum-oxide, as the interfacial layer to improve barrier height. A method of preparing this Schottky diode structure is also disclosed in the present invention.

3 Claims, 8 Drawing Sheets

N-INP SCHOTTKY DIODE STRUCTURE AND A METHOD OF MAKING THE SAME

This is a divisional application of U.S. application Ser. No. 08/426,643, filed Apr. 21, 1995, which is a continuation of U.S. application Ser. No. 08/255,163, filed Jun. 7, 1994, now abandoned.

BACKGROUND OF THE INVENTION

1. Field of the Invention

The present invention relates to a Schottky diode structure and a manufacturing method thereof, and more particularly to a Schottky diode structure based on metal/n-InP contact.

2. Description of the Prior Art

Owing to the surface Fermi level pinning arising from the presence of large surface states and other nonstoichiometric defects, the Schottky barrier height greater than 0.5 eV is very difficult to obtain on n-InP. Such a small barrier height causes a large reverse leakage current and hinders the development of inP device applications. A common approach to increase the Schottky barrier height is to form a thin dielectric layer between the metal and the n-InP substrate. Various techniques such as $H_2$-plasma or $PH_3$-plasma treatment, growing a thin $P_3N_5$ film, $PO_xN_yH_z$ film, or an interfacial oxide layer on the InP surface were employed to treat the surface of InP to increase the Schottky barrier height. Schottky diodes fabricated by applying these techniques typically have a barrier height of about 0.7–0.8 eV. Recently, a low temperature (77K) deposition was reported for the metal/n-InP contact to obtained a Schottky barrier height as high as 0.96 eV [Z. Q. Shi, et. al., Appl. Phys. lett. 59, 446 (1991)]; however, it also has a shortcoming of large reverse leakage current. J. Dunn and G. B. Stringfellow in their article, entitled "Ag/Al Schottky Contacts on n-InP", Journal of Electronic Material 17, 181 (1988), disclose Ag/Al/n-InP Schottky diode which has a barrier height of only 0.65 eV. Moreover, the current voltage characteristics of this Ag/Al/n-InP Schottky diode is also not very satisfactory.

Therefore, there is a need in the industry to develop a new structure of Schottky diode having a relatively higher barrier height and a reduced reverse leakage current.

SUMMARY OF THE INVENTION

An object of the present invention is to provide a n-InP Schottky diode structure which has a relatively higher barrier height and a reduced reverse leakage current.

Another object of the present invention is to provide a method of manufacturing n-InP Schottky diode structure which has a relatively higher barrier height and a reduced reverse leakage current.

In order to achieve these objects, a n-InP Schottky diode structure constructed in accordance the present invention comprises:

an undoped n-InP substrate having a native $InPO_4$ on its surfaces;

an aluminum layer having a thickness of 80–120 Å being formed on an upper surface of the n-InP substrate; and a platinum layer formed on the aluminum layer, in which the aluminum layer is converted to an aluminum oxide interfacial layer between the n-InP substrate and the platinum layer after reacting with the native $InPO_4$ of the InP substrate.

Preferably, an ohmic contact is formed on a bottom surface of the n-InP, substrate which is opposite to the upper surface of the n-InP substrate.

A method of manufacturing the n-InP Schottky diode structure of the present invention comprising the following steps:

a) forming an insulating layer on a surface of an undoped n-InP substrate;

b) forming contact patterns on the insulating layer by photolithography with a photoresist composition;

c) etching the patterned insulating layer to form contact windows;

d) depositing an aluminum layer on the surface having contact windows of the resulting n-InP substrate of step c);

e) depositing a platinum layer on the aluminum layer;

f) dissolving the photoresist composition patterns under the aluminum layer with a solvent so that the portions of the aluminum and the platinum deposited on the photoresist composition patterns are removed and the portions of the aluminum and the platinum deposited in the contact windows are remained on the n-InP substrate; and g) annealing the resulting Pt/Al/n-InP contact of step f), in which the aluminum layer of step d) has a thickness of 80–120 Å and is converted to an aluminum oxide interfacial layer between the n-InP substrate and the platinum layer after reacting with a native $InPO_4$ at the surface of the n-InP substrate.

A Pt/Al/n-InP Schottky diode made in accordance with one of the preferred embodiments of the present invention gives a barrier height of 0.74 eV and an ideality factor of 1.11 from its I-V (current density-voltage) characteristics plot, and a barrier height of 0.9 eV from its C-V (capacity-voltage) characteristics plot.

—  — represents Al element, — ⋯ — ⋯ — represents Pt element, and — — — — represents P element.

DETAILED DESCRIPTION OF THE PREFERRED EMBODIMENTS

In this invention, a Pt/Al/n-InP Schottky diode structure and a method of making same are disclosed. The Pt/Al/n-InP Schottky diode structure comprises:

an undoped n-InP substrate;

an aluminum layer having a thickness of 80–120 Å being formed on an upper surface of the n-InP substrate; and a platinum layer formed on the aluminum layer.

It was reported by J. R. Waldrop, et. al. in an article, entitled "Summary Abstract: Fermi-level pinning energy and chemistry at InP(100) interfaces", J. Vac. Sci. Technol. B 1 (3), Jul.–Sep. 1983, that a ~4 Å thick InPO$_4$ native-oxide layer exists on the initial etched surface of InP wafer. Therefore, it is believed that the aluminum layer of the Pt/Al/n-InP Schottky diode structure will be converted to an aluminum oxide interfacial layer between the n-InP substrate and the platinum layer after reacting with the native InPO$_4$ of the InP substrate during a deposition process of forming the Al layer and/or an annealing treatment after a deposition process of forming the Pt layer.

Figure 1:
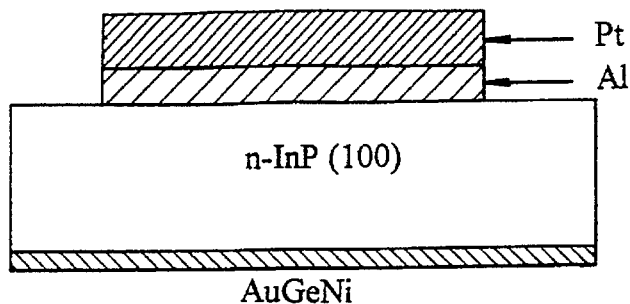
FIG. 1 is a schematic cross-sectional view of a Pt/Al/n-InP Schottky diode made in accordance with one of the preferred embodiments of the present invention.

FIG. 1 illustrates a schematic cross-sectional view of a Pt/Al/n-InP Schottky diode made in accordance with one of the preferred embodiments of the present invention, in which a layer of AuGeNi is formed on the bottom surface of the InP substrate as an ohmic contact.

Figure 2A:
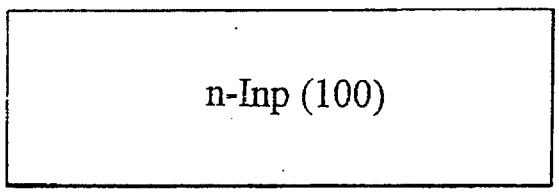
FIG. 2(a)–2(g) are schematic cross-sectional views of a device during key steps of a method of manufacturing the Pt/Al/n-InP Schottky diode shown in FIG. 1.
Figure 2B:
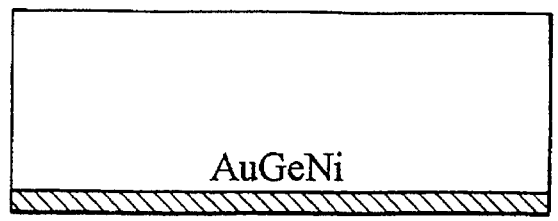
Figure 2C:
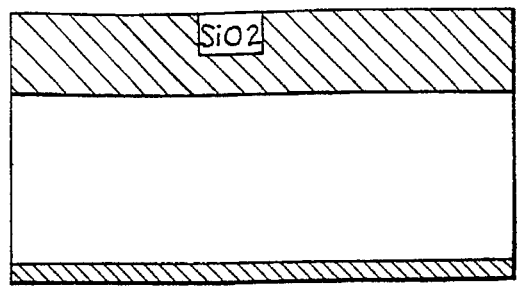
Figure 2D:
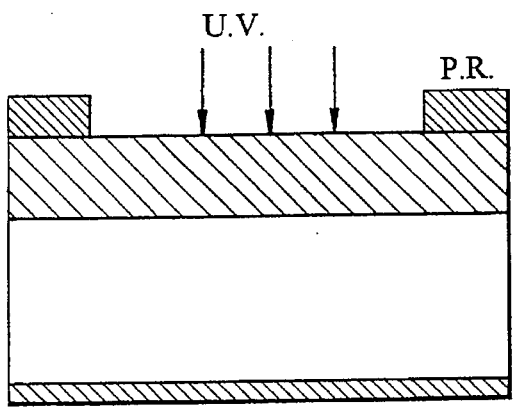
Figure 2E:
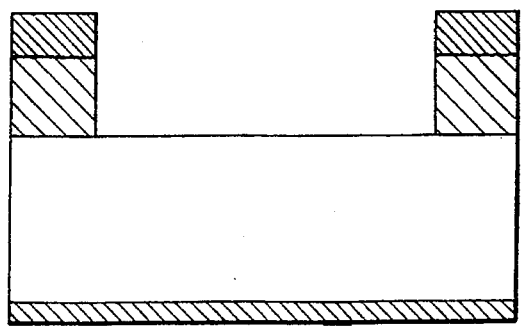
Figure 2F:
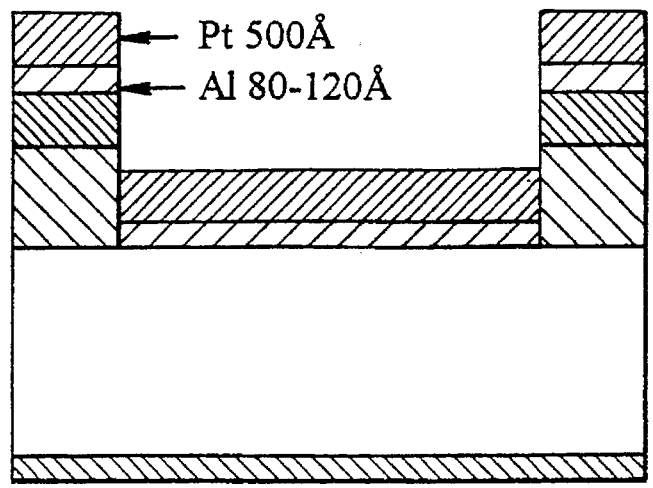
Figure 2G:
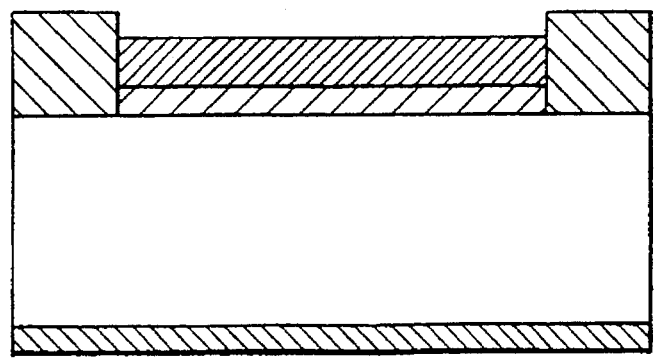

A suitable method of manufacturing the Pt/Al/n-InP Schottky diode shown in FIG. 1 will be described in the following text by referring to FIG. 2(a)–FIG. 2(g). The devices were made on undoped n-type InP substrates having a free carrier concentration of 5–9×10$^{15}$ cm$^{-3}$, as illustrated in FIG. 2(a). Ohmic contacts were formed on the backside of the substrate by evaporating AuGeNi and annealing at 400° C. for 3 min, as shown in FIG. 2(b). The wafers were then degreased with trichloroethylene (TCE), acetone (ACE), methanol and deionized water in sequence and then soaked in H$_2$SO$_4$ (98%) for 3 min and etched in NH$_4$OH:H$_2$O$_2$:H$_2$O=3:1:15 for 3 min to remove the surface damages. A thickness of 2000 Å of SiO$_2$ was then deposited on the wafers by plasma enhanced chemical vapor deposition (PECVD), as shown in FIG. 2(c), and the contact patterns were defined by photolithography technique with a positive photoresist composition (P.R.), as shown in FIG. 2(d). The SiO$_2$ in the contact windows were etched by a buffered oxidant etchant (BOE), and then rinsed in deionized water, as shown in FIG. 2(e). The multilayer metals Pt(500 Å)/Al(85 Å) were deposited sequentially upon the samples by sputtering at a vacuum of 4×10$^{-6}$ Torr, as shown in FIG. 2(f), and metal patterns were obtained by using a lift-off process in which the P.R. under the aluminum layer was dissolved in acetone so that the portions of the aluminum and the platinum deposited on the P.R. were removed and the portions of the aluminum and the platinum deposited in the contact windows were remained on the n-InP substrate. The wafers were then annealed in an N$_2$ gas flow in a furnace, as shown in FIG. 2(g). The diode area was equal to 0.000225 cm$^2$.

To evaluate the depth distribution of all elements of the deposition films, a secondary ion mass spectrometer (SIMS) analysis was performed, of which the primary beam was a $^{133}$Cs$^+$ beam at 10 KeV with a current of 16 nA and a rastering area of 225×225 μm$^2$.

Figure 3:
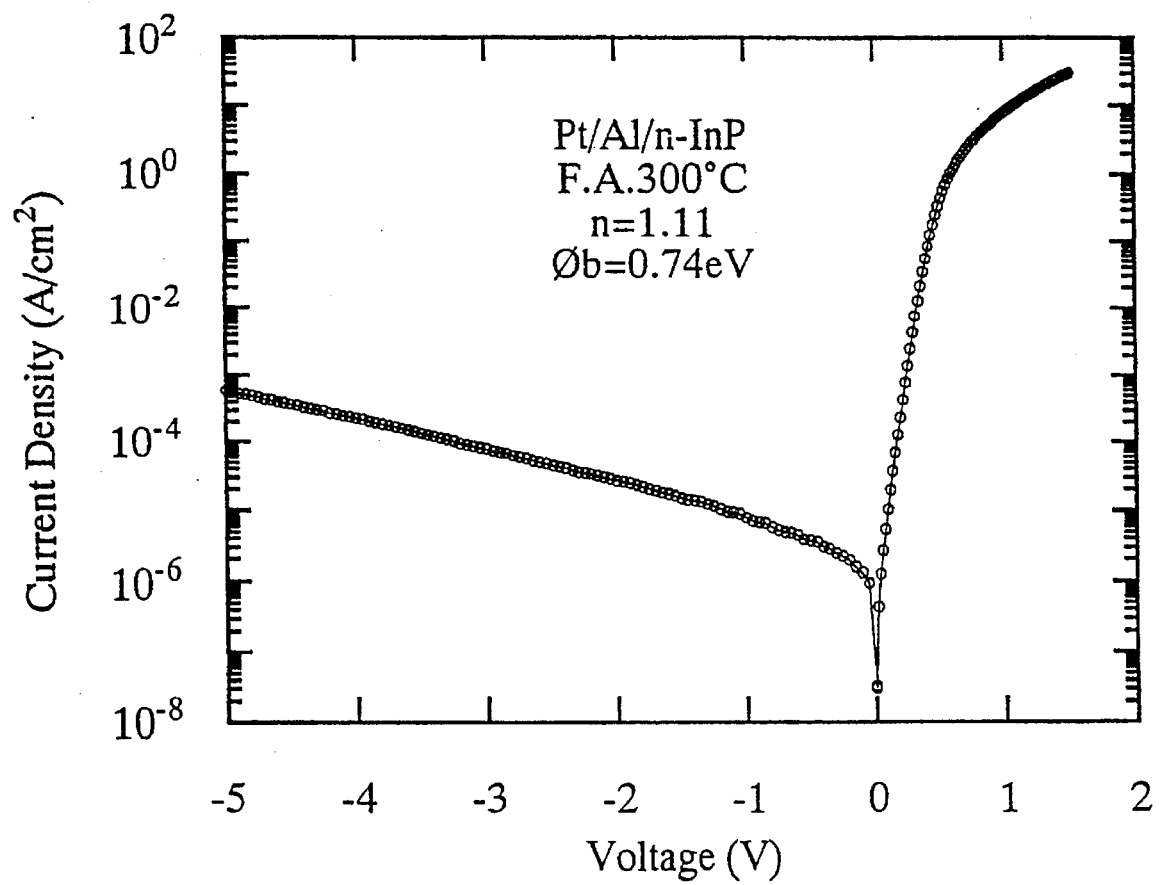
FIG. 3 is a plot which shows the I-V characteristics of Pt(500 Å)/Al(85 Å)/n-InP Schottky contact after furnace annealing (F.A.) at 300° C. for 10 min.
Figure 4:
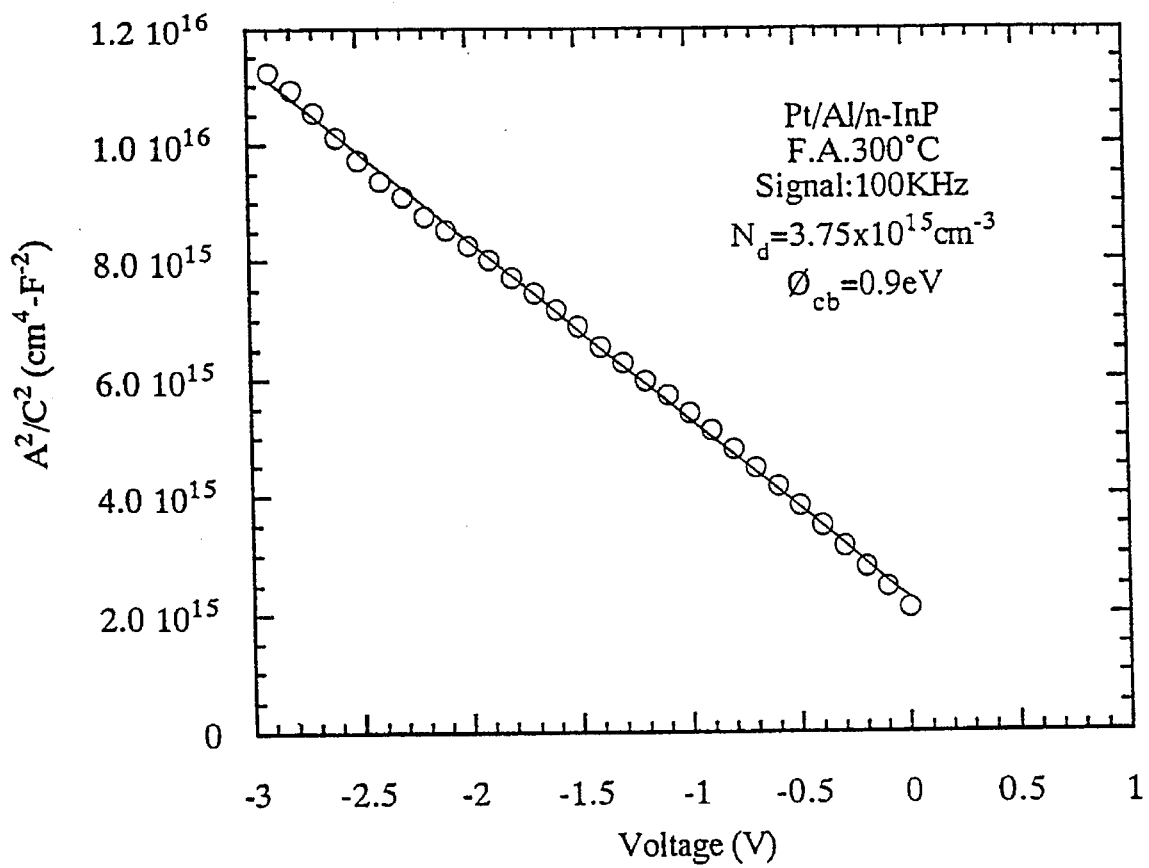
FIG. 4 is a plot which shows the C-V characteristics of Pt(500 Å)/Al(85 Å)/n-InP Schottky contact after furnace annealing (F.A.) at 300° C. for 10 min.

FIG. 3 shows the current density-voltage (I–V) characteristics of the fabricated Pt(500 Å)/Al(85 Å)/n-InP Schottky diodes after annealing at 300° C. for 10 minutes. The effective barrier height, $\varnothing_b$, was calculated from the following equation. $\varnothing_b=(kT/q)\ln(A^*T^2/J_0)$ where $A^*$=9.6 Acm$^{-2}$K$^{-2}$ is the Richardson constant, and $J_0$ is the saturation current density. The ideality n factor is determined from the forward characteristics using the relations $n=q/kT[\partial V/\partial(\ln J)]$. The barrier height and ideality factor were 0.74 eV and 1.11 respectively. The ideality n factor exceed unity was due to the existence of the interfacial layer. The corresponding C–V data for the Schottky diode (the concentration of donor ions $N_d$=3.75×10$^{15}$ cm$^{-3}$), taken at 100 KHz over a 0 to –3 V range, were analyzed according to the conventional model that gives $\varnothing_{cb}$ in terms of the intercept $V_i$ (found by a least-square fitting) in the voltage axis of a 1/C$^2$ vs V plot. There were no significant deviations from linearity in the 1/C$^2$ vs V plot, as shown in FIG. 4. The $\varnothing_{cb}$ was equal to 0.9 eV, substantially larger than the value from the I-V characteristics.

Figure 5:
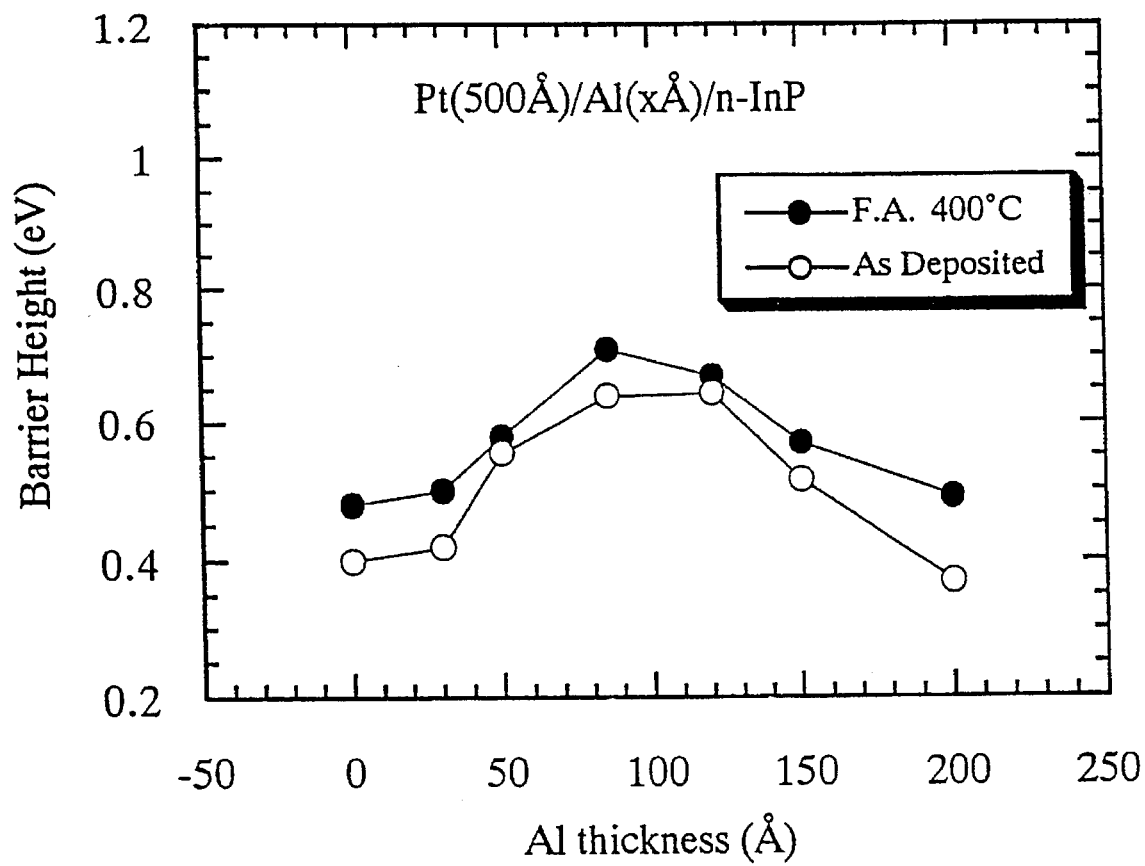
FIG. 5 is a plot which shows the Schottky barrier heights dependence on the sandwiched Al thickness for Pt (500 Å)/Al(x Å)/n-InP Schottky diodes fabricated without annealing (—o—) and with an 10 minutes' time furnace annealing (F.A.) at 400° C. (—●—).

For the Pt/Al/n-InP Schottky diode, the thickness of Al should be taken into consideration. FIG. 5 shows the barrier height dependence on the Al thickness of the Pt/Al/n-InP device, where the thickness of Pt was kept constant as 500 Å and the thickness of Al was varied from 0 to 200 Å. The barrier height of the Pt/n-InP contact nearly "ohmic". The barrier height increased from 0.4 eV to 0.72 eV and 0.64 eV for the 406° C., 10 min annealed and the as-deposited devices for the Al thickness was increased to 85 Å respectively. It was reported that an InP wafer, after the final rinse in the deionized water, a thin native oxide, InPO$_4$, exists on the surface. It is speculated that this native oxide would react with the deposited Al during the deposition process to form an Aluminum-oxide, and the oxygen in the chamber was captured during Al deposition which serves as the sandwiched insulator between the InP substrate and Pt layer which was deposited in the following sequence. As the thickness of deposited Al increased, the interfacial layer increased too, as a result of increasing effective barrier height. But for thicker Al layer (200 Å) of the Pt/Al/InP contact, the Al was thick enough to form interfacial layer and remained some unreacted Al. The structure could modify as Pt/Al/interfacial-layer/InP contact structure. Its electrical characteristic was similar to single metal Al contacted to InP, with very low barrier height and large leakage current. So there existed a $\varnothing_{cb}$ peaks and then decreased with increasing Al thickness as shown in FIG. 5. A furnace annealing would help enhance the reaction of the Al with the oxide. This is manifested by the data in FIG. 5 for the annealed devices, for which the barrier height values are higher.

Figure 6:
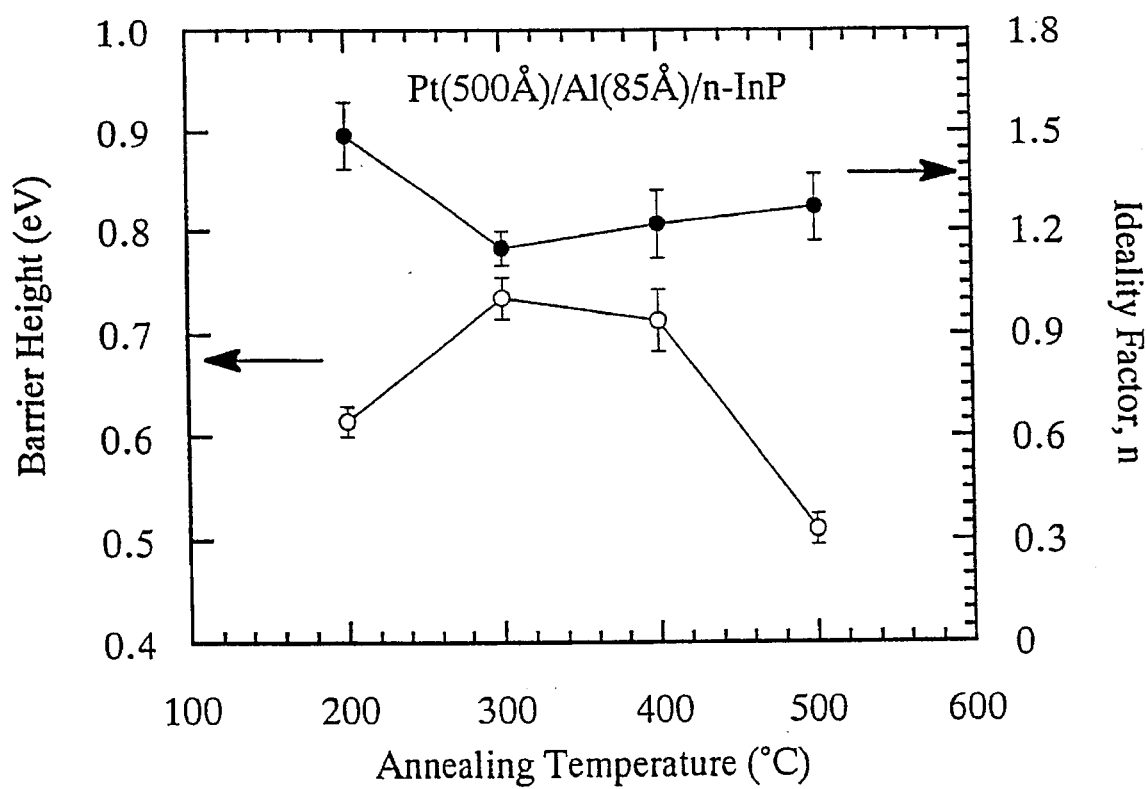
FIG. 6 is a plot which shows the Schottky barrier heights and ideality factors dependence on the annealing temperature used in the fabrication of Pt(500 Å)/Al(85 Å)/n-InP Schottky diodes.

FIG. 6 is a plot which shows the Schottky barrier heights and ideality factors dependence on the annealing temperatures used in the fabrication of Pt(500 Å)/Al(85 Å)/n-InP Schottky diodes. A suitable annealing temperature will be about 300°–400° C. for the fabrication of Pt(500 Å)/Al(85 Å)/n-InP Schottky diode.

Figure 7:
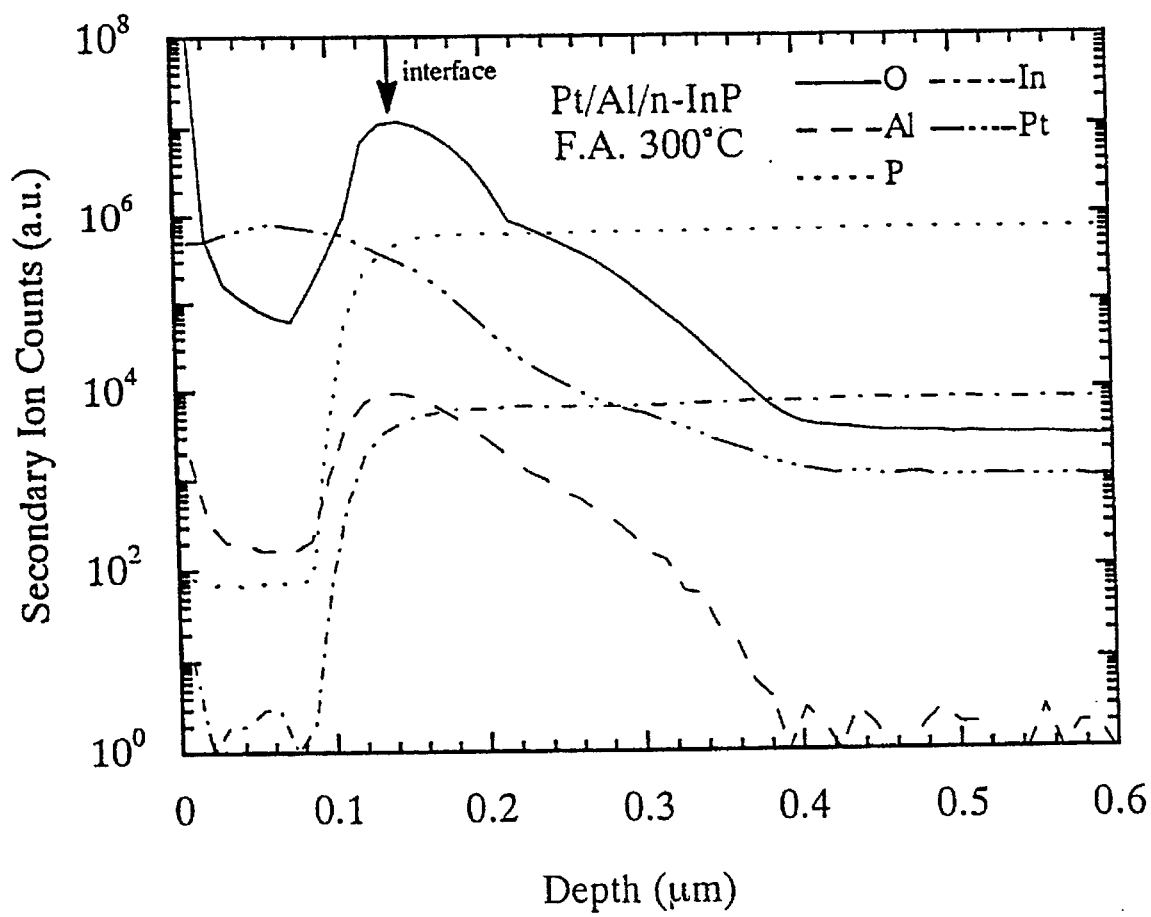
FIG. 7 is a plot which shows the SIMS (Secondary Ion Mass Spectrometer) in-depth profile of secondary ion counts in the Pt(500 Å)/Al(85 Å)/n-InP Schottky diode after furnace annealing (F.A.) at 300° C. for 10 min, wherein ——— represents O element, —·—·— represents In element, —

FIG. 7 is a plot which shows the SIMS in-depth profile of secondary ion counts in the Pt/Al/n-InP Schottky diodes after annealing at 300° C. for 10 min. There existed a significant amount of oxygen at the interface. This supported the point of view for the formation of Aluminum-oxide in the contact surface.

In conclusion, a new Schottky contact structure, Pt/Al/n-InP, which was prepared in a simple process but could give a good diode performance was disclosed. Different thickness of Al gave different value of barrier height. It is found that as the thickness of Al equal to 80–120 Å could obtain better $\phi_b$ value. For the diode of Pt(500 Å)/Al(85 Å)/n-InP its barrier height equal to 0.74 eV after it was annealed at 300° C. for 10 min. This good performance is to be believed due to the effect of the formation of interfacial oxide layer.

Although the preferred embodiment of the invention has been disclosed above for illustration purpose, those skilled in the art will appreciate that various modifications, additions and substitution are possible without departing from the scope and spirit of the invention as set forth in the accompanying claims.

What is claimed is:

1. A method of manufacturing all n-InP Schottky diode structure comprising the following steps:

a) forming an insulating layer on a surface of an n-InP substrate having a native $InPO_4$ on its surfaces;

b) forming contact patterns on the insulating layer by photolithography with a photoresist composition;

c) etching the patterned insulating layer to form contact windows on the n-InP substrate;

d) depositing an aluminum layer having a thickness of from about 80 Å to about 120 Å on the surface having contact windows of the resulting n-InP substrate of step c);

e) depositing a platinum layer on the aluminum layer;

f) dissolving the photoresist composition patterns under the aluminum layer with a solvent so that the portions of the aluminum and the platinum deposited on the photoresist composition patterns are removed and the portions of the aluminum and the platinum deposited in the contact windows remain on the n-InP substrate; and g) annealing the resulting Pt/Al/n-InP contact of step f.

2. The method according to claim 1, wherein the insulating layer in step a) is $SiO_2$.

3. The method according to claim 1, wherein an ohmic contact is formed on a surface of the n-InP substrate opposite to the surface having the insulating layer thereon prior to step a).

\* \* \* \* \*